United States Patent
Nakamata et al.

(10) Patent No.: US 10,890,617 B2
(45) Date of Patent: Jan. 12, 2021

(54) ELECTRONIC COMPONENT CHARACTERISTIC DETECTION APPARATUS

(71) Applicant: DENSO CORPORATION, Kariya (JP)

(72) Inventors: Keita Nakamata, Nisshin (JP); Shinji Ohoka, Nisshin (JP); Toshihiro Hattori, Kariya (JP); Takahiro Tsuda, Kariya (JP)

(73) Assignee: DENSO CORPORATION, Kariya (JP)

( * ) Notice: Subject to any disclaimer, the term of this patent is extended or adjusted under 35 U.S.C. 154(b) by 79 days.

(21) Appl. No.: 16/279,165

(22) Filed: Feb. 19, 2019

(65) Prior Publication Data

US 2019/0324079 A1    Oct. 24, 2019

(30) Foreign Application Priority Data

Apr. 19, 2018 (JP) .................... 2018-80511

(51) Int. Cl.
*G01R 31/28* (2006.01)

(52) U.S. Cl.
CPC ................. *G01R 31/2851* (2013.01)

(58) Field of Classification Search
None
See application file for complete search history.

(56) References Cited

U.S. PATENT DOCUMENTS

| 7,145,351 B2 * | 12/2006 | Mizoguchi ......... G01R 31/2808 |
| | | 324/750.19 |
| 2020/0168434 A1 * | 5/2020 | Murobayashi .... H01L 21/67248 |

FOREIGN PATENT DOCUMENTS

JP    2011-007619 A    1/2011

* cited by examiner

*Primary Examiner* — Jermele M Hollington
(74) *Attorney, Agent, or Firm* — Posz Law Group, PLC

(57) ABSTRACT

A characteristic detection apparatus includes: a characteristic detector that detects an electrical characteristic of an electronic component placed on a substrate; and a pressing member that is provided separately from the characteristic detector, and generates a pressing force to press the characteristic detector to the substrate, causing the characteristic detector to be electrically connected to the electronic component.

11 Claims, 7 Drawing Sheets

ELECTRONIC COMPONENT CHARACTERISTIC DETECTION APPARATUS

CROSS REFERENCE TO RELATED APPLICATION

The present application claims the benefit of priority from Japanese Patent Application No. 2018-80511 filed on Apr. 19, 2018. The entire disclosure of the above application is incorporated herein by reference.

TECHNICAL FIELD

The present disclosure relates to an electronic component characteristic detection apparatus.

BACKGROUND

An electronic component characteristic detection apparatus that can detect an electrical characteristic is proposed.

SUMMARY

The present disclosure provides a characteristic detection apparatus configured to detect an electrical characteristic of an electronic component placed on a substrate. The characteristic detection apparatus may include a characteristic detector and a pressing member.

The characteristic detector may be able to detect the electrical characteristic of the electronic component. The pressing member may be separately provided from the characteristic detector, and generate the pressing force to press the characteristic detector to the substrate, causing the characteristic detector to be electrically connected to the electronic component.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

An electronic component characteristic detection apparatus is placed on a substrate. The electronic component characteristic detection apparatus can detect an electrical characteristic. For example, a comparative example describes a test device of a semiconductor device. The semiconductor device includes a bypass capacitor electrically connectable to the semiconductor placed on the substrate, and includes a weight material applying a load to the bypass capacitor so that an electric wiring of the substrate contacts to the semiconductor, the electric wiring electrically connecting to the semiconductor.

However, in the test device for the semiconductor device described in the comparative example, the bypass capacitor contacts to the electric wiring by weight of the weight material. The weight material contacts to the electric wiring only in a vertical direction so as to apply the weight of the weight material. It may be difficult to maintain a satisfactory electrical connection between the electric wiring and the bypass capacitor with respect to a position relation between the substrate and the weight material. Therefore, it may be difficult to surely detect an electrical characteristic of the semiconductor.

A characteristic detection apparatus is configured to detect an electrical characteristic of an electronic component placed on a substrate. The characteristic detection apparatus includes a characteristic detector and a pressing member.

The characteristic detector may be able to detect the electrical characteristic of the electronic component. The pressing member may be separately provided from the characteristic detector, and generate the pressing force to press the characteristic detector to the substrate, causing the characteristic detector to be electrically connected to the electronic component.

The characteristic detection apparatus according to the present disclosure may generate the pressing force to press the characteristic detector to the substrate. The characteristic detector can surely contact to the electronic component placed on the substrate without being affected by the position of the characteristic detector to the substrate. The characteristic detection apparatus can surely detect the electrical characteristic of the electronic component.

Multiple embodiments of the present disclosure will be described with reference to the drawings. In the following embodiments, substantially identical portions will be indicated by the same reference signs and will not be described redundantly.

First Embodiment

Figure 1:
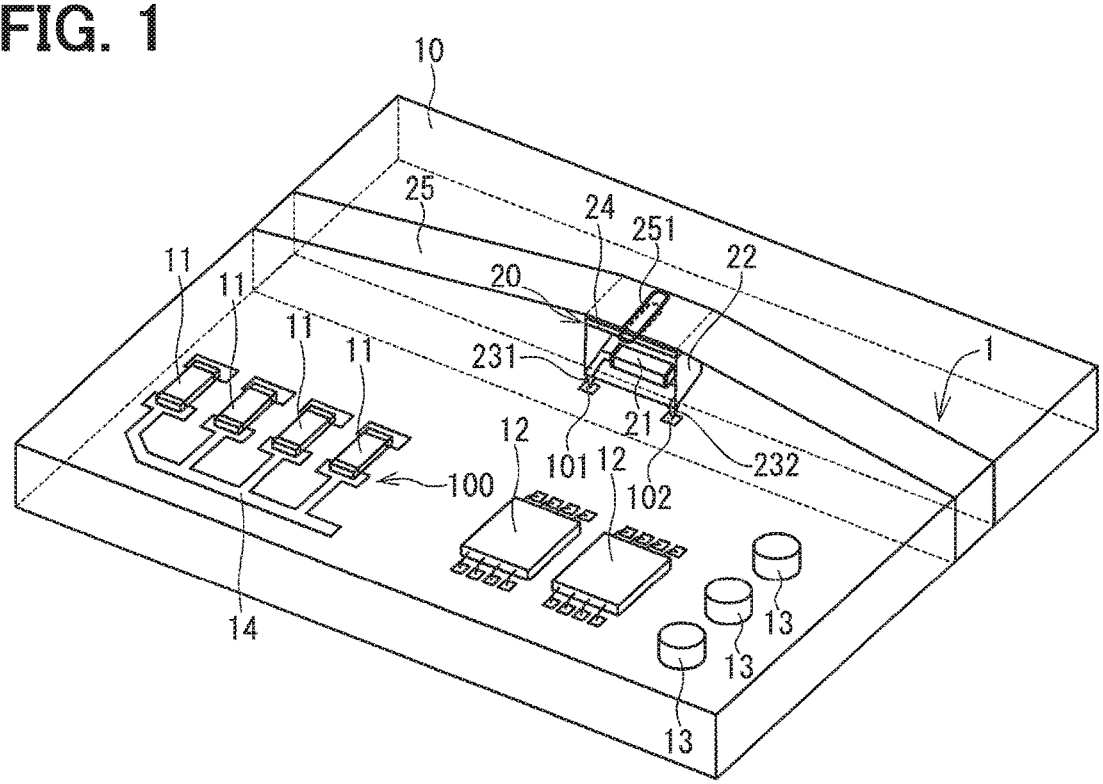
FIG. 1 is a schematic view illustrating an electronic component characteristic detection apparatus according to a first embodiment.

FIGS. 1 to 4 illustrate an electronic component characteristic detection apparatus in a first embodiment. A characteristic detection apparatus 1 corresponds to "the electronic component characteristic detection apparatus". The characteristic detection apparatus 1 is used for a substrate 10 where a resistor 11, an IC 12, and a circuit capacitor 13 are placed as shown in FIG. 1. In the embodiment, the substrate 10 includes the multiple resistors 11, the multiple ICs 12, the multiple circuit capacitors 13, and an electric wiring 14 electrically connecting the resistors 11, the ICs 12, and the circuit capacitor 13. A noise of an electric signal corresponds to "an electrical characteristic". The noise occurs in an electric circuit 100. The electric circuit 100 corresponds to "an electronic component" of the substrate 10. The characteristic detection apparatus 1 selects a capacitor for suppressing the noise.

Figure 2:
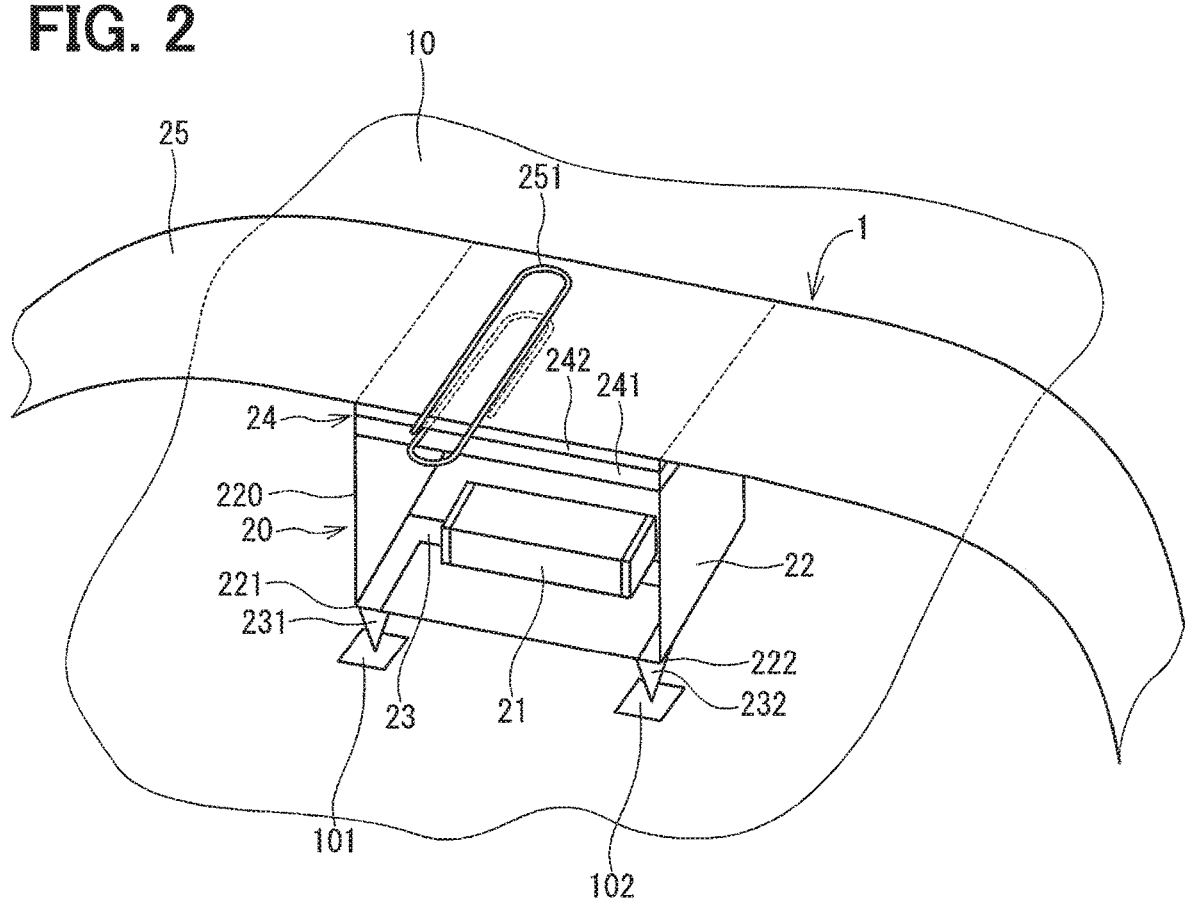
FIG. 2 is a partially enlarged view illustrating the electronic component characteristic detection apparatus according to the first embodiment.

The characteristic detection apparatus 1 includes a noise prevention capacitor 21, a housing 22, connection terminals 231 and 232, a support terminal 233, and a rotation portion 24, and a band 25, as shown in FIG. 2. The noise prevention capacitor 21 corresponds to "a characteristic detector". The housing 22, the connection terminals 231 and 232, the support terminal 233, and the rotation portion 24 correspond to "a supporter". The band 25 corresponds to "a pressing member". In the embodiment, the noise prevention capacitor 21, the housing 22, the connection terminals 231 and 232, the support terminal 233, and the rotation portion 24 are integrated, and can be exchanged for the band 25. Conveniently, a unit 20 may be referred to as a configuration in which the noise prevention capacitor 21, the housing 22, the connection terminals 231 and 232, the support terminal 233, and the rotation portion 24 are integrated (or unitized) as one body. In the other words, the noise prevention capacitor 21, the housing 22, the connection terminals 231 and 232, the support terminal 233, and the rotation portion 24 are made into one piece. In the embodiment, each of the multiple units 20 including the noise prevention capacitor 21 having a different electrical characteristic is prepared. The band 25 is separately provided from the noise prevention capacitor 21. That is, the band 25 is a discrete body separate from the noise prevention capacitor 21. In other words, the pressing member may be separately placed from the characteristic detector.

The housing 22 stores the noise prevention capacitor 21. In the embodiment, the electric signal of the electric circuit 100 includes the noise. The various kinds of the noise prevention capacitor 21 having a different electric amount are respectively employed corresponding to a characteristic of the noise. Each of the multiple units 20 stores the noise prevention capacitor 21 so that the noise prevention capacitor 21 is electrically connectable to the electric wiring 14. A user of the characteristic detection apparatus 1 may select the unit 20 storing the noise prevention capacitor 21 that can most suppress the noise included in the electric signal of the electric circuit 100 from the multiple units 20.

The housing 22 is a member formed in a rectangular shape and has an opening 220. The housing 22 internally has a conductive wiring 23 electrically connected to the noise prevention capacitor 21 and the noise prevention capacitor 21. The conductive wiring 23 is placed on an inner wall of the housing 22. The conductive wiring 23 is electrically connected to the connection terminals 231 and 232.

Figure 3:
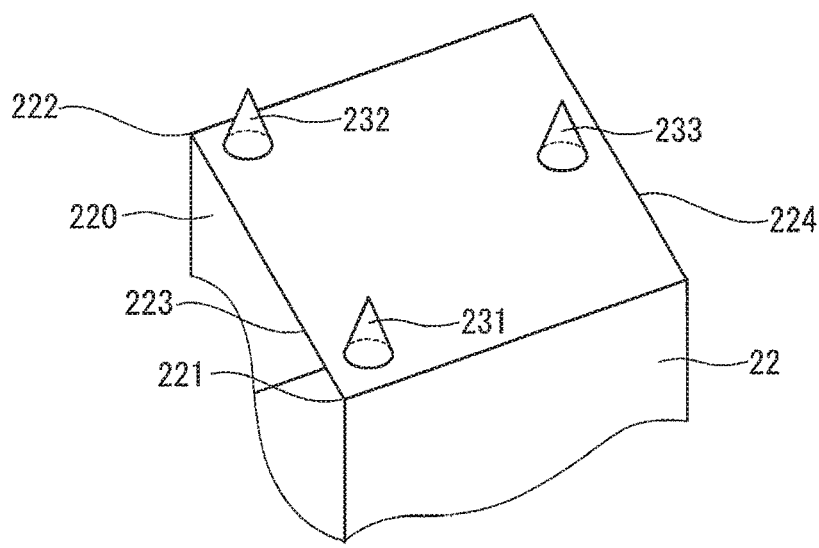
FIG. 3 is a schematic view illustrating a substrate-side surface of a housing included in the electronic component characteristic detection apparatus according to the first embodiment.

As shown in FIG. 3, the connection terminals 231 and 232 are members in a substantially conical shape, and are placed on an outer wall of the housing 22. Each of the connection terminals 231 and 232 can contact to substrate-side terminals 101 and 102 of the electric wiring 14. In the embodiment, the connection terminals 231 and 232 are placed on two corner portions 221 and 222 adjacent to each other. The corner portions 221 and 222 form the opening 220 of the housing 22. The connection terminals 231 and 232 electrically connect the noise prevention capacitor 21 to the electric wiring 14.

As shown in FIG. 3, the support terminal 233 is placed on an edge portion 224 opposite to an edge portion 223 connecting the two corner portions 221 and 222 of the housing 22. The support terminal 233 is not electrically connected to the conductive wiring 23. The support terminal 233 is formed in the substantially conical shape similarly to the connection terminals 231 and 232. The support terminal 233, together with the connection terminals 231 and 232, stabilizes the housing 22 to the substrate 10. For example, the characteristic detection apparatus 1 includes two connection terminals and one support terminal.

Figure 4:
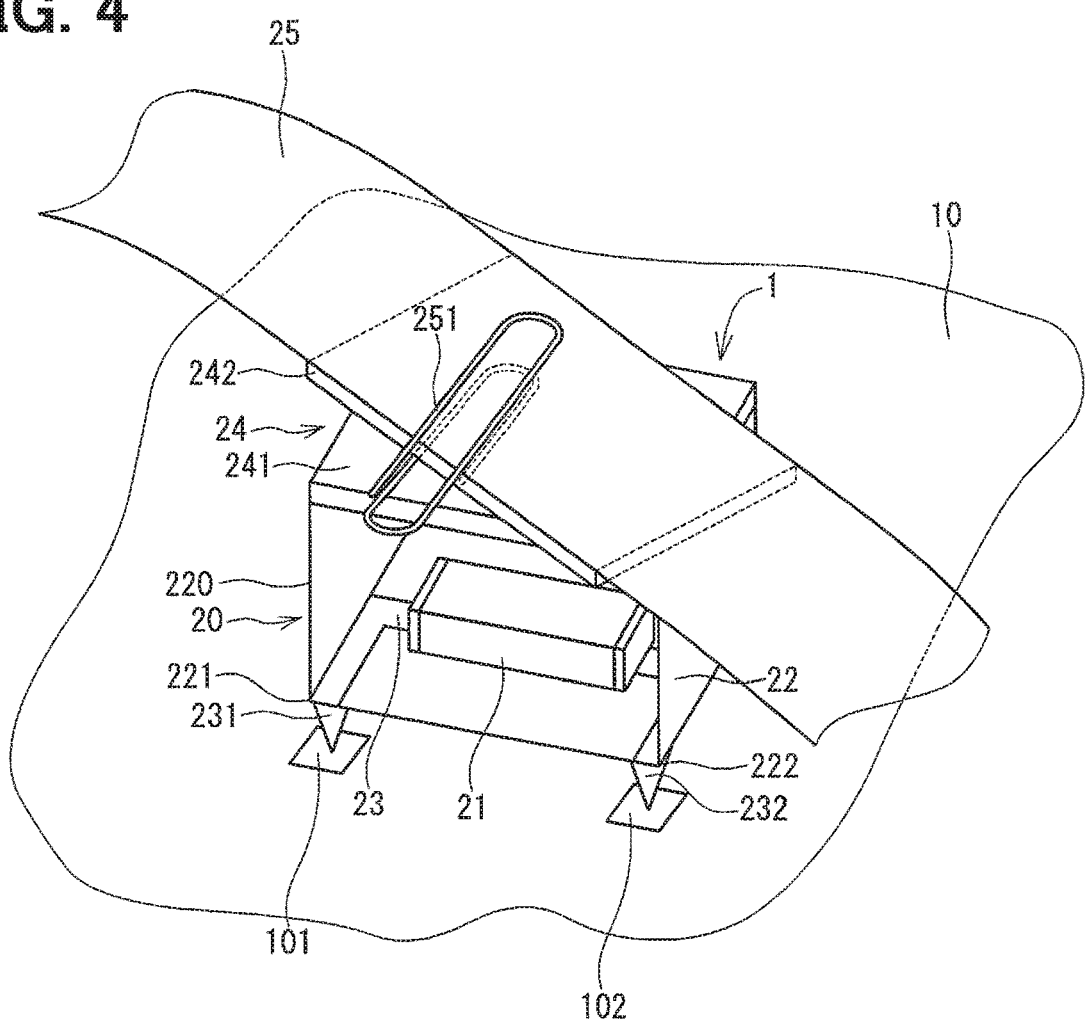
FIG. 4 is a partially enlarged view for describing operation of the electronic component characteristic detection apparatus according to the first embodiment.

The rotation portion 24 is placed between the housing 22 and the band 25. The rotation portion 24 includes a housing-side fixing portion 241 fixed to the housing 22 and a belt-side fixing portion 242 fixed to the band 25. The housing-side fixing portion 241 and the belt-side fixing portion 242 are formed so as to be rotatable relative to each other. The rotation portion 24 enables the housing 22 to relatively rotate to the band 25 as shown in FIG. 4.

The band 25 is a member formed in a circular shape. The band 25 is formed from only an insulation material having elastic force. As shown in FIG. 1, the band 25 is wound around the substrate 10. The band 25 is fixed to the belt-side fixing portion 242 by a fixing tool 251. In a state shown in FIG. 1, the band 25 generates a pressing force to press the unit 20 to the substrate 10.

In the characteristic detection apparatus 1 of the first embodiment, the band 25 generates the pressing force to press to the substrate 10, the connection terminals 231 and 232 electrically connected to the noise prevention capacitor 21. The noise prevention capacitor 21 can surely contact to the electric wiring 14 of the substrate 10 without being affected by the position relation of the noise prevention capacitor 21 to the substrate 10. The characteristic detection apparatus 1 can select the appropriate noise prevention capacitor 21 for suppressing the noise included in the electric signal by the electric circuit 100 on the substrate 10. That is, the characteristic detection apparatus 1 can surely detect the electrical characteristic of the substrate 10.

Since the pressing force to press the connection terminals 231 and 232 to the substrate 10 occurs, the band 25 can reduce a contact resistance between the connection terminals 231, 232 and the substrate-side terminals 101, 102. The characteristic detection apparatus 1 can detect the electrical characteristic of the substrate 10 with high accuracy.

The noise prevention capacitor 21, the housing 22, the connection terminals 231 and 232, the support terminal 233, and the rotation portion 24 are integrated, and can be exchanged for the band 25. It may be possible to easily exchange the noise prevention capacitor 21 having a different electric amount corresponding to the electrical characteristic of the substrate 10.

When the unit 20 is placed on the substrate 10, in addition to the connection terminals 231 and 232, the support terminal 233 contacts to the substrate 10. It may be possible to stabilize the unit 20 having the housing 22 since the housing 22 is placed on the substrate 10 due to the three terminals.

The noise prevention capacitor 21 and the electric circuit 100 on the substrate 10 are electrically connected by the connection terminals 231 and 232 formed in the substantially conical shape. The characteristic detection apparatus 1 can reduce the contact resistance between the noise prevention capacitor 21 and the electric circuit 100 on the substrate 10.

The characteristic detection apparatus 1 of the first embodiment has the rotation portion 24 between the housing 22 and the band 25. The rotation portion 24 enables relative rotation of the housing 22 to the band 25. It may be possible to set any position of the band 25 winding around the substrate 10. The characteristic detection apparatus 1 can set the band 25 with avoiding the resistor 11, the IC 12 on the substrate 10.

The band 25 is formed from the insulation material having the elastic force. It may be possible to prevent unintentional noise from flowing into the electric signal of the electric circuit 100 via the band 25.

In the characteristic detection apparatus 1 of the first embodiment, the pressing force of the band 25 presses the noise prevention capacitor 21 to the substrate-side terminals 101 and 102. It may be possible to eliminate operation by an operator's hand when detecting the electrical characteristic of the substrate 10. The characteristic detection apparatus 1 can eliminate an effect of a human body to the detection of the electrical characteristic.

Second Embodiment

Figure 5:
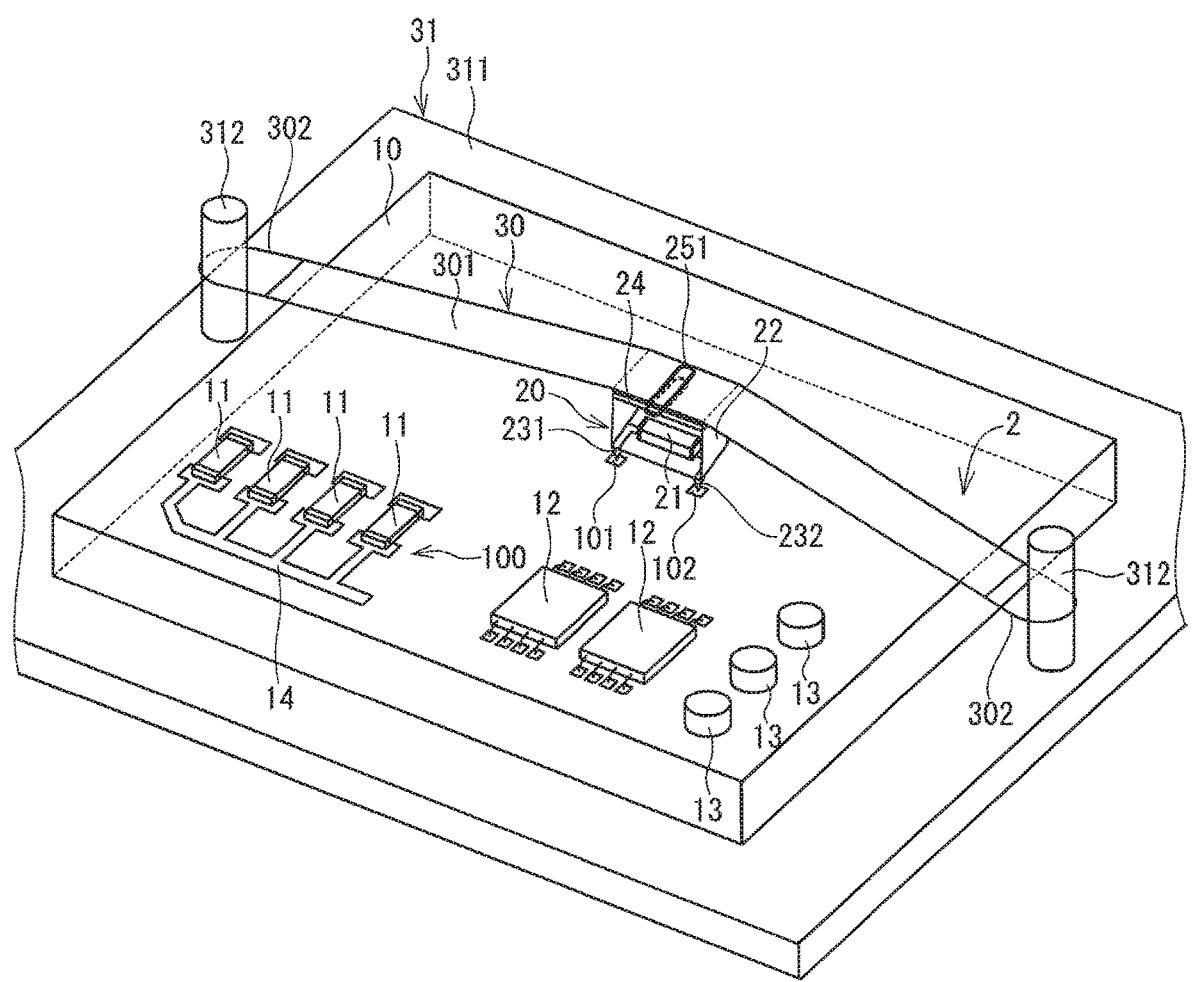
FIG. 5 is a schematic view illustrating an electronic component characteristic detection apparatus according to a second embodiment.

FIG. 5 illustrates the electronic component characteristic detection apparatus in a second embodiment. The second embodiment is different from the first embodiment in a shape of the band.

In the second embodiment, a characteristic detection apparatus 2 includes a noise prevention capacitor 21, the housing 22, the connection terminals 231 and 232, the support terminal 233, the rotation portion 24, and a band 30 and a base 31. The noise prevention capacitor 21 corresponds to "the electronic component". The band 30 corresponds to "the pressing member".

The band 30 is a member formed in the circular shape. As shown in FIG. 5, the band 30 has a bandlike portion 301 and two circular portions 302.

The bandlike portion 301 is formed from the insulation material having the elastic force. The bandlike portion 301 is fixed to the belt-side fixing portion 242 by the fixing tool 251. In a state shown in FIG. 5, the bandlike portion 301 generates the pressing force to press the unit 20 to the substrate 10.

Two circular portions 302 are respectively placed at two longitudinal ends of the bandlike portion 301. The circular portion 302 is formed in the circular shape and is formed so that an engagement portion 312 can be inserted.

The base 31 has a base portion 311 and the two engagement portions 312.

The base portion 311 corresponds to a plate member, and is formed so that the substrate 10 can be mounted on the base portion 311. The base portion 311 includes a surface where the substrate 10 can be mounted. The two engagement portions 312 are placed on the surface.

The engagement portion 312 corresponds to a member formed in a columnar shape. The engagement portion 312 is formed so as to protrude from the surface of the base portion 311, the surface being where the substrate 10 can be mounted. A distance between the two engagement portions 312 is longer than a length of the substrate 10. For example, the length of the substrate 10 may correspond to one side length of the substrate 10.

In the characteristic detection apparatus 2 of the second embodiment, the band 30 generates the pressing force to press to the substrate 10, the connection terminals 231 and 232 electrically connected to the noise prevention capacitor 21. The characteristic detection apparatus 2 provides the similar effect to the first embodiment.

In the characteristic detection apparatus 2 of the second embodiment, the band 30 has the circular portion 302 at both ends of the band 30. The circular portion 302 can be engaged with the engagement portion 312 of the base 31. The band 30 can apply the pressing force by the band 30 to the unit 20 due to the engagement of the circular portion 302 and the engagement portion 312. Even when the band 30 cannot be wound around the substrate 10, the connection terminals 231 and 232 are pressed to the substrate 10. The characteristic detection apparatus 2 can surly detect the electrical characteristic of the substrate 10.

Third Embodiment

Figure 6:
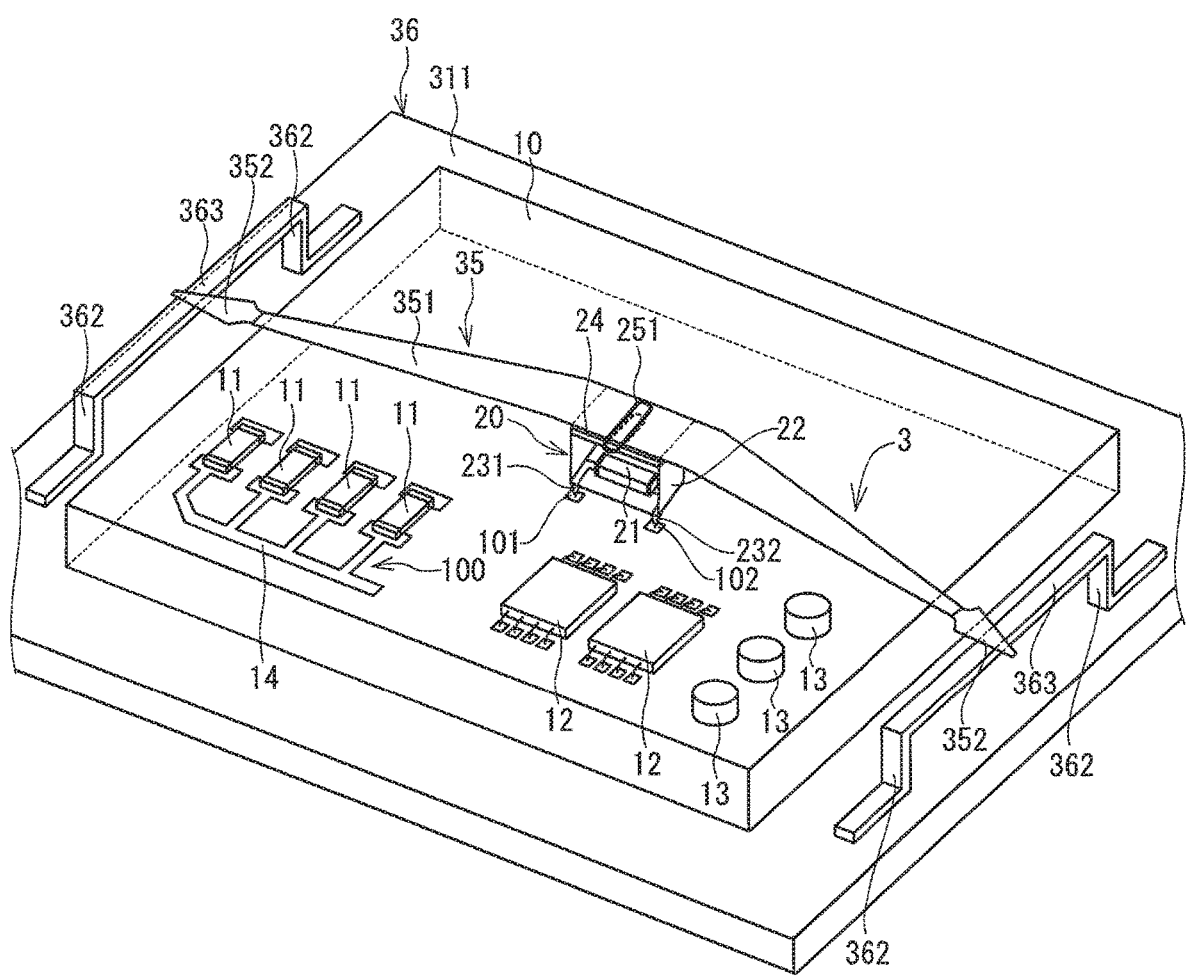
FIG. 6 is a schematic view illustrating an electronic component characteristic detection apparatus according to a third embodiment.

FIG. 6 illustrates the electronic component characteristic detection apparatus in a third embodiment. The third embodiment is different from the first embodiment in the shape of the band.

In the third embodiment, a characteristic detection apparatus 3 includes the noise prevention capacitor 21, the housing 22, the connection terminals 231 and 232, the support terminal 233, the rotation portion 24, a band 35 and a base 36. The noise prevention capacitor 21 corresponds to "the electronic component characteristic detection apparatus". The band 35 corresponds to "the pressing member".

The band 35 is a member formed in a substantially bandlike shape. As shown in FIG. 6, the band 35 has a bandlike portion 351 and two clips 352.

The bandlike portion 351 is formed from the insulation material having the elastic force. The bandlike portion 351 is fixed to the belt-side fixing portion 242 by the fixing tool 251. In a state shown in FIG. 6, the bandlike portion 351 generates the pressing force to press the unit 20 to the substrate 10.

The two clips 352 are respectively placed at two longitudinal ends of the bandlike portion 351. The clip 352 is formed so as to grasp a horizontal portion 363.

The base 36 has the base portion 311, a rising portion 362, and the horizontal portion 363. In the embodiment, the rising portion 362 and the horizontal portion 363 are integrally formed.

The rising portion 362 is formed so as to protrude from the surface of the base portion 311, the surface being where the substrate 10 can be mounted. As shown in FIG. 6, the two rising portions 362 are placed in the vicinity of a first side of the substrate 10 and in a vicinity of a second side, respectively.

The two horizontal portions 363 are formed in substantially parallel with the surface of the base portion 311, the surface being where the substrate 10 can be mounted. The first horizontal portions 363 of the two horizontal portions 363 are placed at positions separated from the surface of the base portion 311 where the substrate 10 can be mounted, at a certain distant. The substrate 10 can be mounted on the surface due to the two rising portions 362 placed along the first side of the substrate 10. The second horizontal portion 363 of the two horizontal portions 363 are placed at positions at a certain distant from the surface of the base portion 311 where the substrate 10 can be mounted. The substrate 10 can be mounted on the surface due to the two rising portions 362 placed along the second side of the substrate 10.

In the characteristic detection apparatus 3 of the third embodiment, the band 35 generates the pressing force to press to the substrate 10, the connection terminals 231 and 232 electrically connected to the noise prevention capacitor 21. The characteristic detection apparatus 3 provides the similar effect to the first embodiment.

In the characteristic detection apparatus 3 of the third embodiment, the two clips 352 of the band 35 respectively grasp the first horizontal portion 363 and the second horizontal portion 363. It may be possible to apply the pressing force by the band 35 to the unit 20. Even when the band 35 cannot be wound around the substrate 10, the connection terminals 231 and 232 are pressed to the substrate 10. The characteristic detection apparatus 3 can surly detect the electrical characteristic of the substrate 10

Fourth Embodiment

Figure 7:
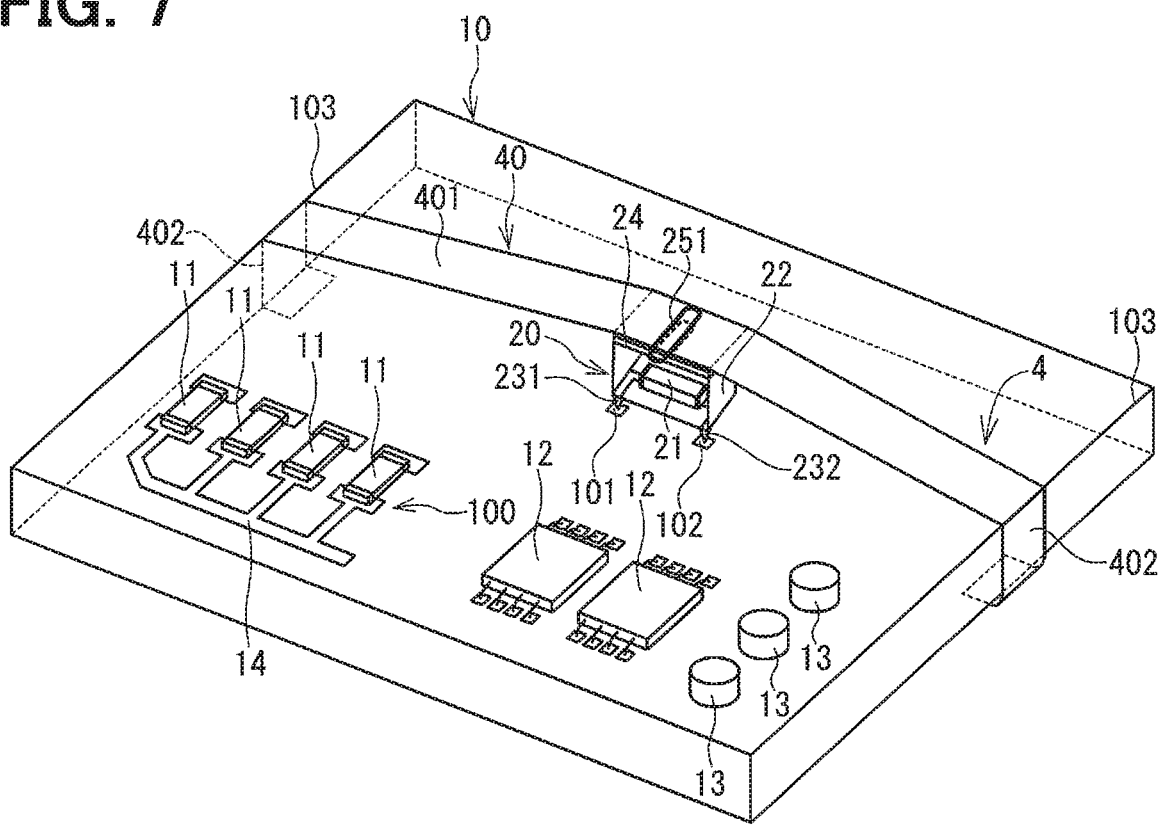
FIG. 7 is a schematic view illustrating an electronic component characteristic detection apparatus according to a fourth embodiment.

FIG. 7 illustrates the electronic component characteristic detection apparatus in a fourth embodiment. The fourth embodiment is different from the first embodiment in the shape of the band.

In the fourth embodiment, a characteristic detection apparatus 4 includes the noise prevention capacitor 21, the housing 22, the connection terminals 231 and 232, the support terminal 233, the rotation portion 24, and a band 40. The noise prevention capacitor 21 corresponds to "the electronic component characteristic detection apparatus". The band 40 corresponds to "the pressing member".

The band 40 is a member formed in the substantially bandlike shape. As shown in FIG. 7, the band 40 has a bandlike portion 401 and two engagement portions 402.

The bandlike portion 401 is formed from the insulation material having the elastic force. The bandlike portion 401 is fixed to the belt-side fixing portion 242 by the fixing tool 251. In a state shown in FIG. 7, the bandlike portion 401 generates the pressing force to press the unit 20 to the substrate 10.

The two engagement portions 402 are respectively placed at each of longitudinal ends of the bandlike portion 401. The engagement portion 402 is bent so as to be engageable with an edge portion 103 of the substrate 10.

In the characteristic detection apparatus 4 of the fourth embodiment, the band 40 generates the pressing force to press to the substrate 10, the connection terminals 231 and 232 electrically connected to the noise prevention capacitor 21. The characteristic detection apparatus 4 provides the similar effect to the first embodiment.

In the characteristic detection apparatus 4 of the fourth embodiment, the two engagement portions 402 of the band 40 are engaged with the edge portion 103 of the substrate 10. It may be possible to apply the pressing force by the band 40 to the unit 20. Even when the band 40 cannot be wound around the substrate 10, the connection terminals 231 and 232 are pressed to the substrate 10. The characteristic detection apparatus 4 can surly detect the electrical characteristic of the substrate 10.

Fifth Embodiment

Figure 8:
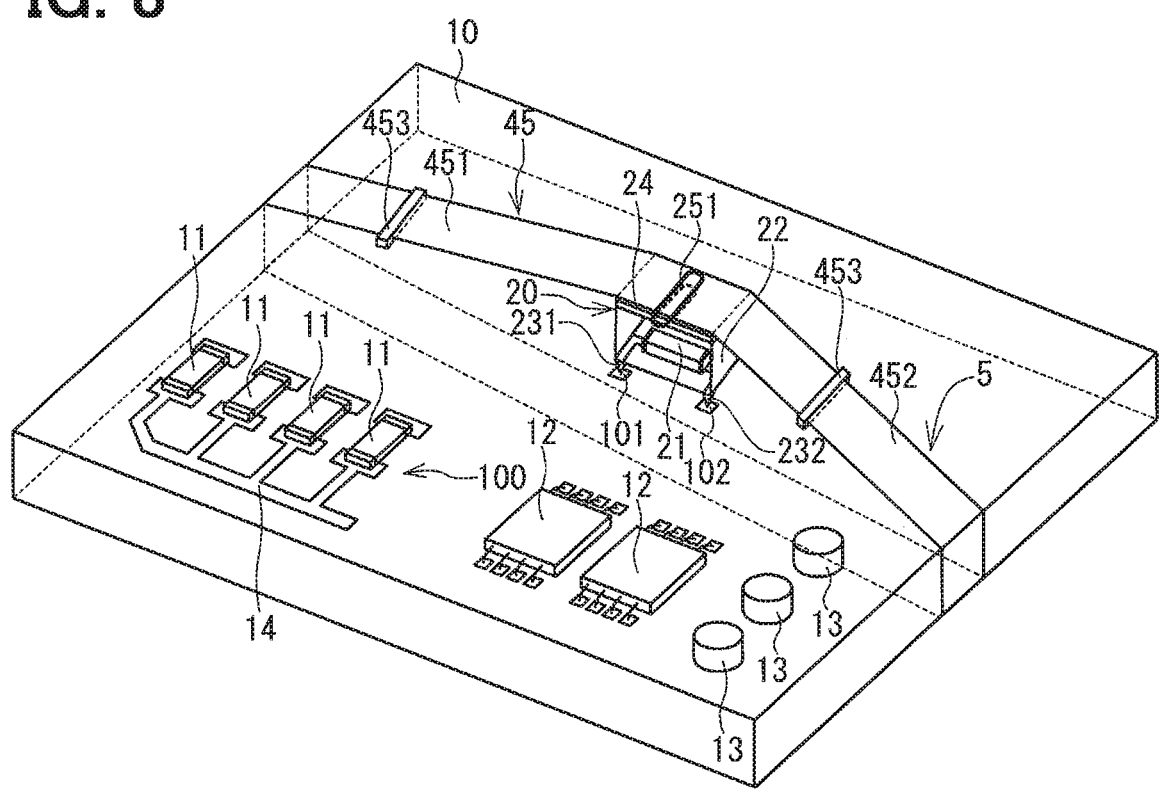
FIG. 8 is a schematic view illustrating an electronic component characteristic detection apparatus according to a fifth embodiment.

FIG. 8 illustrates the electronic component characteristic detection apparatus in a fifth embodiment. The fifth embodiment is different from the first embodiment in the shape of the band.

In the fifth embodiment, a characteristic detection apparatus 5 includes the noise prevention capacitor 21, the housing 22, the connection terminals 231 and 232, the support terminal 233, the rotation portion 24, and a band 45. The noise prevention capacitor 21 corresponds to "the electronic component characteristic detection apparatus". The band 45 corresponds to "the pressing member".

The band 45 is a member formed in the circular shape. As shown in FIG. 8, the band 45 has an inelastic portion 451 and an elastic portion 452.

The inelastic portion 451 is formed from an inelastic material in the bandlike shape. The inelastic portion 451 is fixed to the belt-side fixing portion 242 by the fixing tool 251.

The elastic portion 452 is formed from the elastic material in the bandlike shape. A connection member 453 connects both longitudinal ends of the elastic portion 452 to both longitudinal ends of the inelastic portion 451. As shown in FIG. 8, the elastic portion 452 is wound around the substrate 10 on an opposite surface of the substrate 10 to the surface where the unit 20 is placed.

In the characteristic detection apparatus 5 of the fifth embodiment, the band 45 generates the pressing force to press to the substrate 10, the connection terminals 231 and 232 electrically connected to the noise prevention capacitor 21. The characteristic detection apparatus 5 provides the similar effect to the first embodiment.

In the characteristic detection apparatus 5 of the fifth embodiment, the band 45 includes the inelastic portion 451 formed from the inelastic material and the elastic portion 452 formed from the elastic material. The band 45 can generate both of the appropriate elastic force and the appropriate pressing force. The connection terminals 231 and 232 are stably pressed to the substrate 10. The characteristic detection apparatus 5 can surly detect the electrical characteristic of the substrate 10.

Sixth Embodiment

Figure 9:
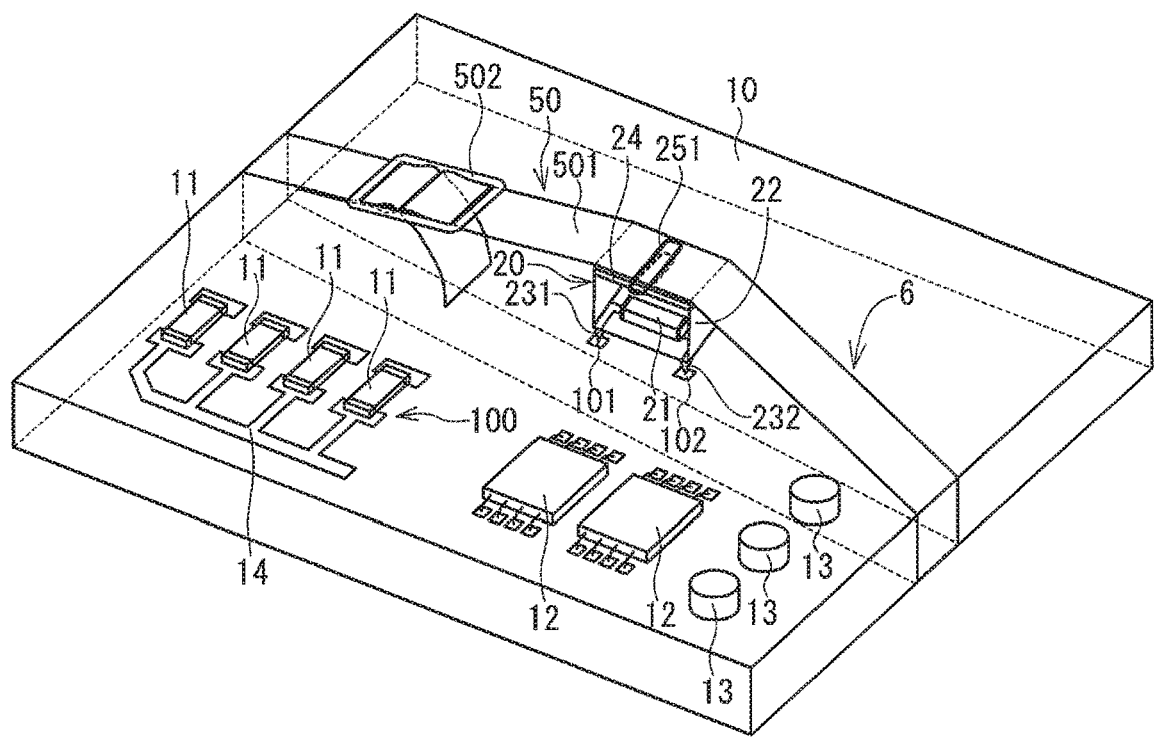
FIG. 9 is a schematic view illustrating an electronic component characteristic detection apparatus according to a sixth embodiment.

FIG. 9 illustrates the electronic component characteristic detection apparatus in a sixth embodiment. The sixth embodiment is different from the first embodiment in a configuration of the band.

In the sixth embodiment, a characteristic detection apparatus 6 includes the noise prevention capacitor 21, the housing 22, the connection terminals 231 and 232, the support terminal 233, the rotation portion 24, and a band 50. The noise prevention capacitor 21 corresponds to "the electronic component characteristic detection apparatus". The band 50 corresponds to "the pressing member".

The band 50 is the member formed in the circular shape. As shown in FIG. 9, the band 50 has a bandlike portion 501 and a length adjuster 502.

The bandlike portion 501 is formed from the insulation material having the elastic force. The bandlike portion 501 is fixed to the belt-side fixing portion 242 by the fixing tool 251. In a state shown in FIG. 9, the bandlike portion 501 generates the pressing force to press the unit 20 to the substrate 10.

The length adjuster 502 is formed to hold both ends of the bandlike portion 501. The length adjuster 502 can adjust the length of the bandlike portion 501 wound around the substrate 10.

In the characteristic detection apparatus 6 of the sixth embodiment, the band 50 generates the pressing force to press to the substrate 10, the connection terminals 231 and 232 electrically connected to the noise prevention capacitor 21. The characteristic detection apparatus 6 provides the similar effect to the first embodiment.

The characteristic detection apparatus 6 in the sixth embodiment has the length adjuster 502 that can adjust the length of the band 50. The length adjuster 502 can set the length of the band 50 to a length enabling the appropriate pressing force to be applied to the unit 20. The connection terminals 231 and 232 are appropriately pressed to the substrate 10. The characteristic detection apparatus 6 can surly detect the electrical characteristic of the substrate 10.

Seventh Embodiment

Figure 10:
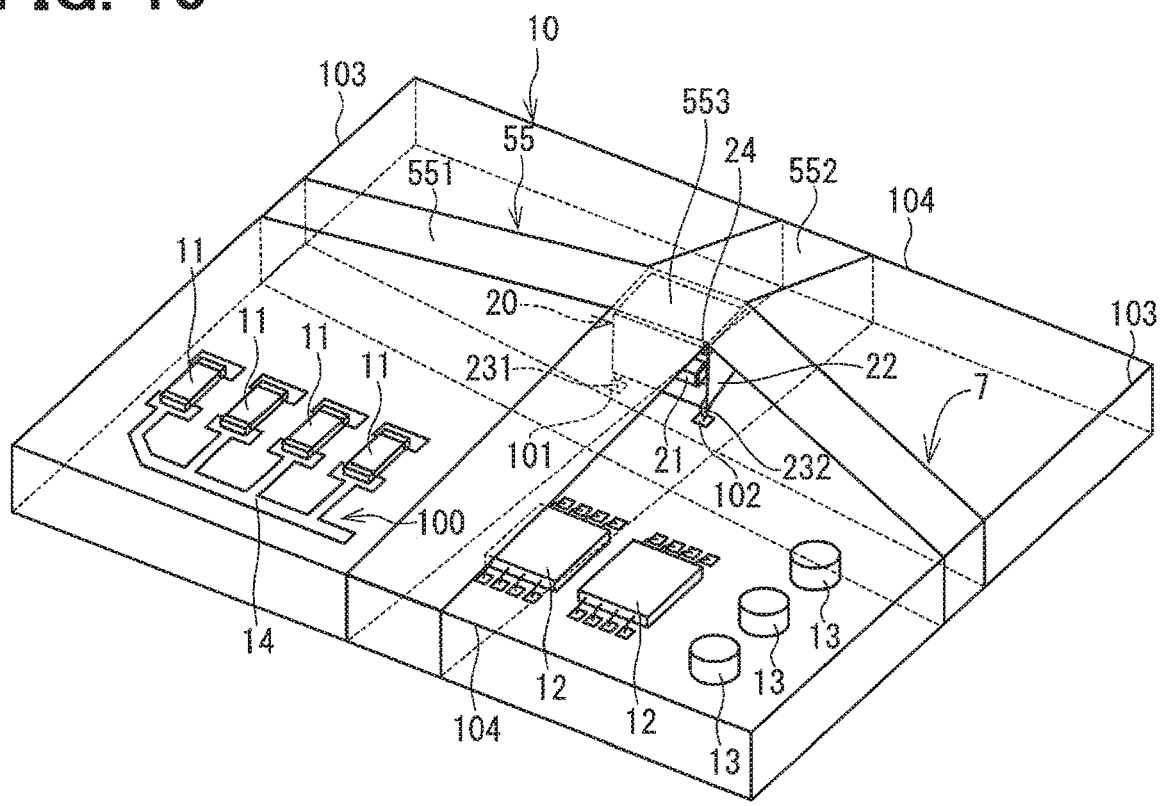
FIG. 10 is a schematic view illustrating an electronic component characteristic detection apparatus according to a seventh embodiment.

FIG. 10 illustrates the electronic component characteristic detection apparatus in a seventh embodiment. The seventh embodiment is different from the first embodiment in a method of using the band.

In the seventh embodiment, a characteristic detection apparatus 7 includes the noise prevention capacitor 21, the housing 22, the connection terminals 231 and 232, the support terminal 233, the rotation portion 24, and a band 55. The noise prevention capacitor 21 corresponds to "the electronic component characteristic detection apparatus". The band 55 corresponds to "the pressing member".

As shown in FIG. 10, the band 55 has a first band portion 551, a second band portion 552, and a crossing portion 553. The first band portion 551 corresponds to "a first portion". The second band portion corresponds to "a second portion". The first band portion 551 and the second band portion 552 may be integrated.

As shown in FIG. 10, the first band portion 551 is formed from the insulation material having the elastic force. The first band portion 551 is placed so as to wind the substrate 10 through the two substantially parallel edge portions 103 of the substrate 10.

As shown in FIG. 10, the second band portion 552 is formed from the insulation material having the elastic force. The second band portion 552 is placed so as to be nonparallel with the first band portion 551. Specifically, the second band portion 552 is placed so as to wind the substrate 10 through the two substantially parallel edge portions 104 of the substrate 10.

The crossing portion 553 is a portion where the first band portion 551 and the second band portion 552 cross, and is located on the opposite side of the unit 20 to the substrate 10. In a state shown in FIG. 10, the crossing portion 553 generates the pressing force to press the unit 20 to the substrate 10.

In the characteristic detection apparatus 7 of the seventh embodiment, the band 55 generates the pressing force to press to the substrate 10, the connection terminals 231 and 232 electrically connected to the noise prevention capacitor 21. The characteristic detection apparatus 7 provides the similar effect to the first embodiment.

In the characteristic detection apparatus 7 of the seventh embodiment, the crossing portion 553 of the band 55 presses the housing 22 to the substrate 10, the crossing portion 553 formed by crossing of two band portions including the first band portion 551 and the second band portion 552. It may be possible to prevent lateral shift of the unit 20 on the substrate 10.

Eighth Embodiment

Figure 11:
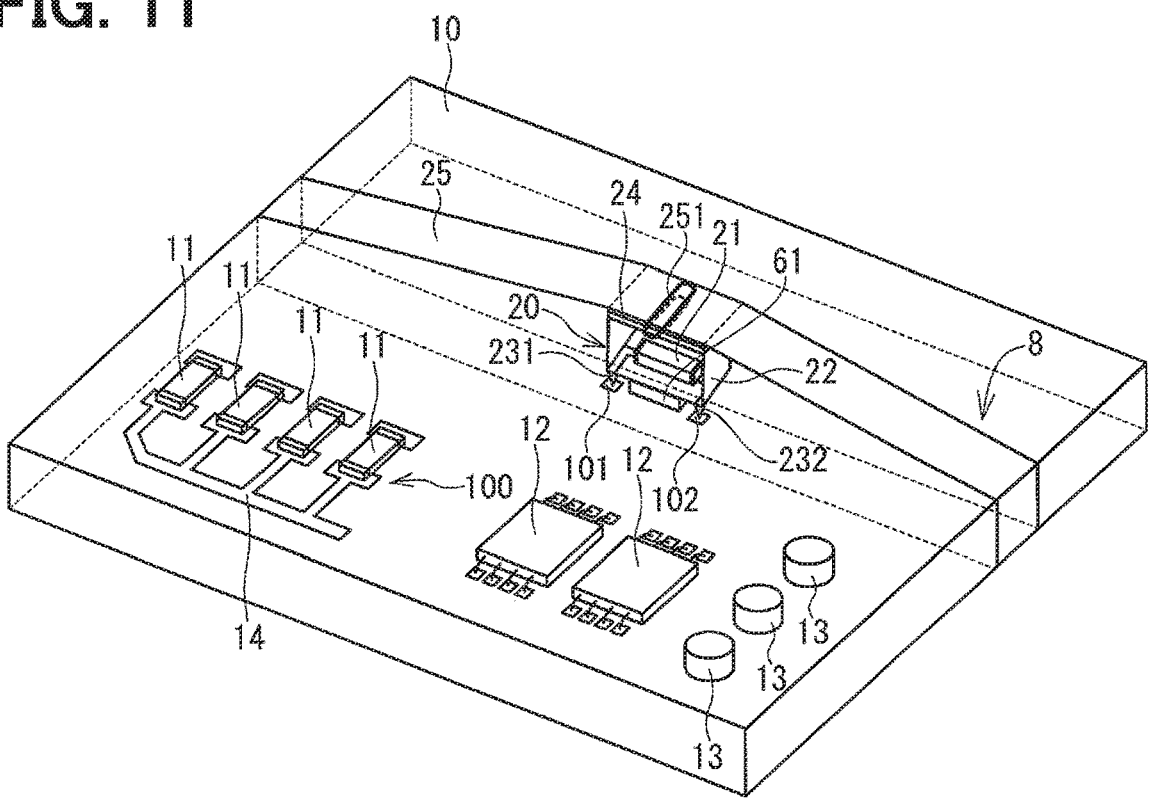
FIG. 11 is a schematic view illustrating an electronic component characteristic detection apparatus according to an eighth embodiment.

FIG. 11 illustrates the electronic component characteristic detection apparatus in an eighth embodiment. The eighth embodiment is different from the first embodiment in a configuration including a shift prevention member.

In the eighth embodiment, a characteristic detection apparatus 8 includes the noise prevention capacitor 21, the housing 22, the connection terminals 231 and 232, the support terminal 233, the rotation portion 24, the band 25 and a shift prevention member 61. The noise prevention capacitor 21 corresponds to "the electronic component characteristic detection apparatus".

The shift prevention member 61 is placed between the unit 20 and the substrate 10. The shift prevention member 61 is formed from the elastic material having a relatively high coefficient of friction. The shift prevention member 61 contacts to the surface of the housing 22 on a side towards the substrate 10 and the surface of the substrate 10 on a side towards the housing 22. The shift prevention member 61 suppresses a change in the relative position of the unit 20 to the substrate 10.

The characteristic detection apparatus 8 in the eighth embodiment includes the shift prevention member 61 for preventing a lateral shift of the unit 20 to the substrate 10. The characteristic detection apparatus 8 can provide the similar effect to the first embodiment, and maintain to surely connect the connection terminals 231 and 232 to the substrate-side terminals 101 and 102.

Ninth Embodiment

Figure 12:
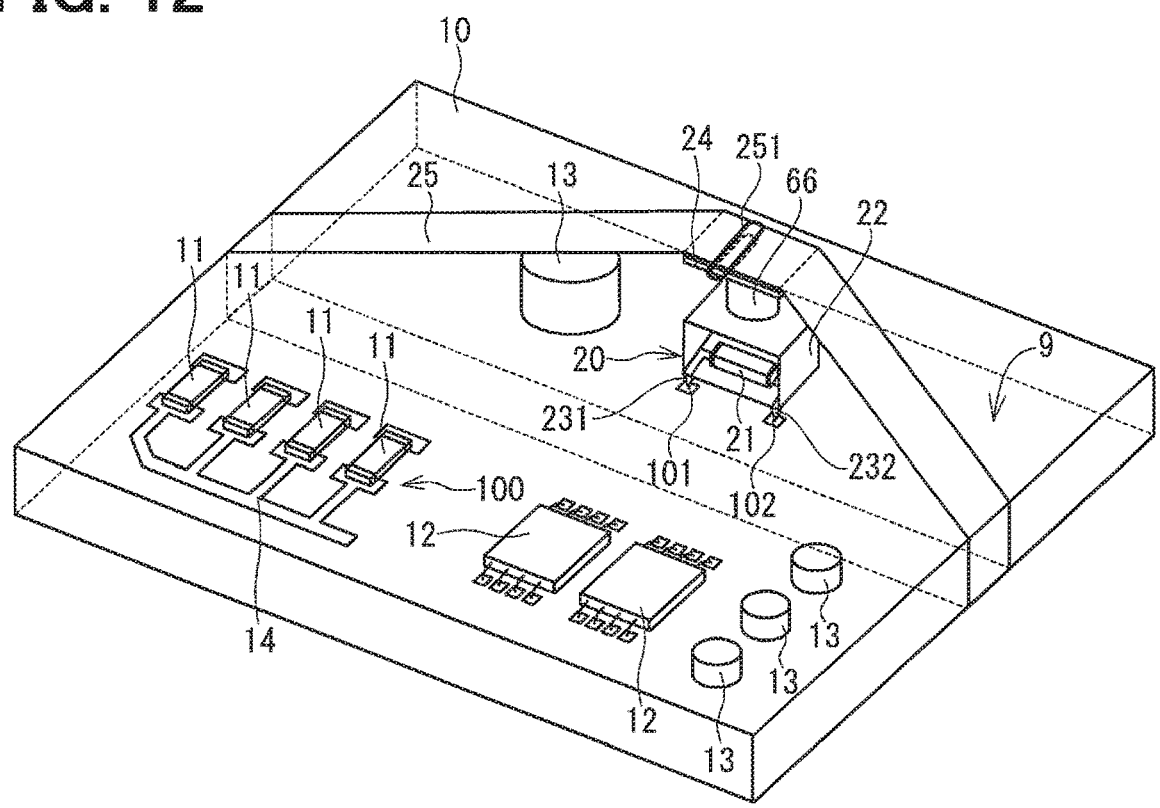
FIG. 12 is a schematic view illustrating an electronic component characteristic detection apparatus according to a ninth embodiment.

FIG. 12 illustrates the electronic component characteristic detection apparatus in a ninth embodiment. The ninth embodiment is different from the first embodiment in a configuration including a height adjuster.

In the ninth embodiment, a characteristic detection apparatus 9 includes the noise prevention capacitor 21, the housing 22, the connection terminals 231 and 232, the support terminal 233, the rotation portion 24, the band 25 and a height adjustment member 66. The noise prevention capacitor 21 corresponds to "the electronic component characteristic detection apparatus".

The height adjustment member 66 is a member in the substantially columnar shape, and is placed between the housing 22 and the rotation portion 24. As shown in FIG. 12, the height adjustment member 66 supports the position of the rotation portion 24 at a distant position from the substrate 10, as compared with the first embodiment.

The characteristic detection apparatus 9 in the ninth embodiment includes the height adjustment member 66 that supports the position of the rotation portion 24 at the distant position from the substrate 10. As shown in FIG. 12, the characteristic detection apparatus 9 can prevent the band 25 from contacting to the circuit capacitor 13 positioned in the vicinity of the substrate-side terminals 101 and 102. The characteristic detection apparatus 9 can provide the similar effect to the first embodiment, and prevent the band 25 from damaging the electric circuit 100 on the substrate 10.

Other Embodiments

In the embodiment, "the characteristic detector" corresponds to the noise prevention capacitor for reducing the noise of the electric wiring. However, "the characteristic detection apparatus" is not limited to this. A resistor that can change the resistance of the electric wiring, an oscilloscope that can detect a signal of the electric wiring, or the like, in other words, a device that even indirectly detects the electrical characteristic of the electric circuit, may be employed.

In the embodiment, "the electronic component" corresponds to the electric circuit of the substrate comprised from the multiple resistors, the multiple ICs, the multiple circuit capacitors, and the electric wiring electrically connecting the resistor, the IC, and the circuit capacitor. "The electrical characteristic of electronic component" corresponds to the noise of the electric circuit. However, "the electronic component" and "the electrical characteristic of electronic component" are not limited to these. The resistance of the electric circuit having "the electrical characteristic of electronic component" or a frequency of the electric signal generated in the electric circuit, or the like may be employed.

In the embodiment, the noise prevention capacitor, and the housing or the like are integrally united. However, these are not limited to the integration. Only the housing may be placed, or "the characteristic detector" stored in the housing may be exchangeable.

In the embodiment, the unit is placed with the two connection terminals and the one support terminal. However, the number of the terminals is not limited to this. The unit may be placed with only the connection terminal.

In the embodiment, "the pressing member" is formed in the circular shape or the bandlike shape. However, the shape of "the pressing member" is not limited to this. For example, a planar shape where the longitudinal length and the lateral length are relatively close may be employed.

In the ninth embodiment, the height adjustment member is placed between the housing and the rotation portion. However, the height adjustment member may be placed between the rotation portion and the belt.

The present disclosure should not be limited to the embodiments described above, and various other embodiments may be implemented without departing from the scope of the present disclosure.

What is claimed is:

1. A characteristic detection apparatus comprising:
    a characteristic detector configured to detect an electrical characteristic of an electronic component placed on a substrate; and
    a pressing member
        provided separately from the characteristic detector, and
        configured to generate a pressing force to press the characteristic detector to the substrate, causing the characteristic detector to be electrically connected to the electronic component,
    wherein:
    the pressing member has a circular shape or a bandlike shape, and
    the pressing member includes a length adjuster configured to adjust a length of the pressing member.

2. The characteristic detection apparatus according claim 1, further comprising:
    at least one of connection terminals configured to electrically connect the electronic component and the characteristic detector; and
    a supporter configured to support the connection terminal and the characteristic detector,
    wherein:
    the pressing member generates the pressing force to press the connection terminal to the substrate via the supporter.

3. The characteristic detection apparatus according to claim 2, further comprising:
    a support terminal provided on the supporter towards the substrate,
    wherein:
    the characteristic detection apparatus includes the two connection terminals.

4. The characteristic detection apparatus according to claim 2, further comprising:
    a rotation portion that
        is placed between the supporter and the pressing member and
        enables the supporter to relatively rotate to the pressing member.

5. The characteristic detection apparatus according to claim 2, wherein:
    the supporter, the characteristic detector, and the connection terminal are unitized.

6. The characteristic detection apparatus according to claim 2, further comprising:
    a shift prevention member that
        is placed between the substrate and the supporter and
        prevents the supporter from shifting from the substrate.

7. The characteristic detection apparatus according to claim 1, further comprising:
    a height adjuster configured to change a height of the pressing member from the substrate.

8. The characteristic detection apparatus according to claim 1, wherein:
    the pressing member has only an insulation material.

9. The characteristic detection apparatus according to claim 1, wherein:
    the pressing member has an elastic material and an inelastic material.

10. The characteristic detection apparatus according to claim 1, wherein:
    the pressing member includes
        a first portion that has a bandlike shape,
        a second portion that is positioned in nonparallel with the first portion and has a bandlike shape, and
        a crossing portion that
            corresponds to a portion where the first portion and the second portion cross each other and
            is positioned on an opposite side to the substrate from the characteristic detector.

11. The characteristic detection apparatus according claim 1, further comprising:
    at least one of connection terminals configured to electrically connect the electronic component and the characteristic detector; and
    a housing configured to
        include the characteristic detector and
        support the connection terminal and the characteristic detector, wherein:
    the pressing member generates the pressing force to press the connection terminal to the substrate via the housing; and
    the connection terminal is placed on an outer wall of the housing.

* * * * *